United States Patent
Gupta et al.

(10) Patent No.: US 6,358,821 B1
(45) Date of Patent: Mar. 19, 2002

(54) METHOD OF COPPER TRANSPORT PREVENTION BY A SPUTTERED GETTERING LAYER ON BACKSIDE OF WAFER

(75) Inventors: Subhash Gupta; Simon Chooi; Sudipto Ranendra Roy; Paul Kwok Keung Ho; Xu Yi; Yakub Aliyu; Mei Sheng Zhou; John Leonard Sudijono, all of Singapore (SG)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/619,376

(22) Filed: Jul. 19, 2000

(51) Int. Cl.⁷ .................................................. H01L 21/22
(52) U.S. Cl. ........................ 438/476; 438/679; 438/687; 438/688
(58) Field of Search ........................... 438/58, 143, 310, 438/402, 471, 476

(56) References Cited

U.S. PATENT DOCUMENTS

| | | | |
|---|---|---|---|
| 3,997,368 A | 12/1976 | Petroff et al. | 148/1.5 |
| 5,296,385 A | 3/1994 | Moslehi et al. | 437/20 |
| 5,360,765 A | 11/1994 | Kondo et al. | 437/192 |
| 5,614,433 A | 3/1997 | Mandelman | 437/57 |
| 5,757,063 A | * 5/1998 | Tomita et al. | |
| 5,958,796 A | 9/1999 | Prall et al. | 438/694 |
| 5,964,953 A | 10/1999 | Mettifogo | 134/2 |
| 5,994,206 A | * 11/1999 | Gupta et al. | |
| 6,043,114 A | * 3/2000 | Kawagoe et al. | |

OTHER PUBLICATIONS

Kastl et al., "Gettering of Impurities from Semiconductor Materials", IBM Technical Disclosure Bulletin, vol. 12, No. 11, p 1983 (1970).*
Morales–Acevedo et al., "Effect of High Temperature Annealing of Aluminum at the back of n+–p–p+siliconSolar Cells Upon Their Spectral and Electrical Characteristics", Solid–State Electronics, 43, p 2075–2079 (1999).*
Santana et al., "Gettring effects by Aluminum Upon the Dark and Illuminated I–V Chacteristics of N+–P–P+ Silicon Solar Cell", Solar Energy Materials & Solar Cells, vol. 62, p 369–378 (2000).*
Bunshah et al., Chapter 5 and 13, Noyes Publication (1982).*

\* cited by examiner

Primary Examiner—Charles Bowers
Assistant Examiner—Stephen W. Smoot
(74) Attorney, Agent, or Firm—George O. Saile; Rosemary L. S. Pike; Stephen G. Stanton

(57) ABSTRACT

A method of preventing copper transport on a semiconductor wafer, comprising the following steps. A semiconductor wafer having a front side and a backside is provided. Metal, selected from the group comprising aluminum, aluminum-copper, aluminum-silicon, and aluminum-copper-silicon is sputtered on the backside of the wafer to form a layer of metal. The back side sputtered aluminum layer may be partially oxidized at low temperature to further decrease the copper penetration possibility and to also provide greater flexibility in subsequent copper interconnect related processing. Once the back side layer is in place, the wafer can be processed as usual. The sputtered back side aluminum layer can be removed during final backside grinding.

41 Claims, 1 Drawing Sheet

METHOD OF COPPER TRANSPORT PREVENTION BY A SPUTTERED GETTERING LAYER ON BACKSIDE OF WAFER

BACKGROUND OF THE INVENTION

A full-faced nitride film may be maintained on the backside of a wafer to prevent diffusion of copper species into the wafer during further processing.

U.S. Pat. No. 5,614,433 to Mandelman describes a method for forming an silicon-on-insulator (SOI) complimentary metal oxide semiconductor (CMOS) integrated circuit (IC), containing NFET's (N-type field effect transistors) and PFET's (P-type field effect transistors). An ion implantation (I/I) of aluminum (Al) is formed below the channel areas of NFET's that suppresses backside leakage in the PFET's and NFET's.

U.S. Pat. No. 5,296,385 to Moslehi et al. describes a method for semiconductor wafer backside preparation to prevent infrared light transmission through the wafer by either heavily damaging the wafer backside or heavily doping the back side wafer, and forming a top layer of silicon nitride over the wafer backside.

U.S. Pat. No. 5,360,765 to Kondo et al. describes a method for forming electrodes of a semiconductor device by forming a contact metal film over a silicon substrate after a cleaning process using a reverse sputtering of argon ions, and then forming a nickel film as a soldering metal on the contact metal film. The amount of argon atoms at the interface between the silicon substrate and the contact metal film is controlled to less than $4.0 \times 10^{14}$ atoms/cm$^2$.

U.S. Pat. No. 5,964,953 to Mettifogo describes a process for removing aluminum contamination from the surface of an etched semiconductor wafer. The semiconductor wafer is first lapped in a lapping slurry containing aluminum, then etched, and then immersed in an aqueous bath comprising an alkaline component and a surfactant.

U.S. Pat. No. 5,958,796 to Prall et al. describes a method of cleaning waste matter from the backside of a semiconductor wafer substrate. A cover layer is deposited over the front side of the wafer and waste matter is removed from the backside of the wafer either by etching the waste matter from the backside with a suitable etchant, or by planarizing the backside of the wafer with a chemical-mechanical planarization (CMP) process.

U.S. Pat. No. 3,997,368 to Petroff et al. describes a method of eliminating stacking faults in silicon devices by a gettering process. Before any high temperature processing steps, a stressed layer is formed on the backside of the wafer and is annealed to cause the nucleation sites to diffuse to a localized region near the back surface. The stressed layer may comprise silicon nitride or aluminum oxide. Enhanced gettering is achieved if interfacial misfit dislocations are introduced into the back surface by, for example, diffusion of phosphorus therein, before forming the stressed layer.

SUMMARY OF THE INVENTION

Accordingly, it is an object of the present invention to prevent transportation of copper on the back side of a wafer by a gettering process comprising sputtering a thin gettering layer on the wafer back side.

Other objects will appear hereinafter.

It has now been discovered that the above and other objects of the present invention may be accomplished in the following manner. Specifically, a semiconductor wafer having a front side and a backside is provided. Metal, selected from the group comprising aluminum, (aluminum alloys, i.e.: aluminum-copper, aluminum-silicon, and aluminum-copper-silicon) is sputtered on the backside of the wafer to form a layer of metal. The back side sputtered aluminum layer may be partially oxidized at low temperature to further decrease the copper penetration possibility and to also provide greater flexibility in subsequent copper interconnect related processing. Once the back side layer is in place, the wafer can be processed as usual. The sputtered back side aluminum layer can be removed during final backside grinding.

BRIEF DESCRIPTION OF THE DRAWINGS

The features and advantages of the method of preventing copper transportation by sputtering a gettering layer on the back side of a wafer according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
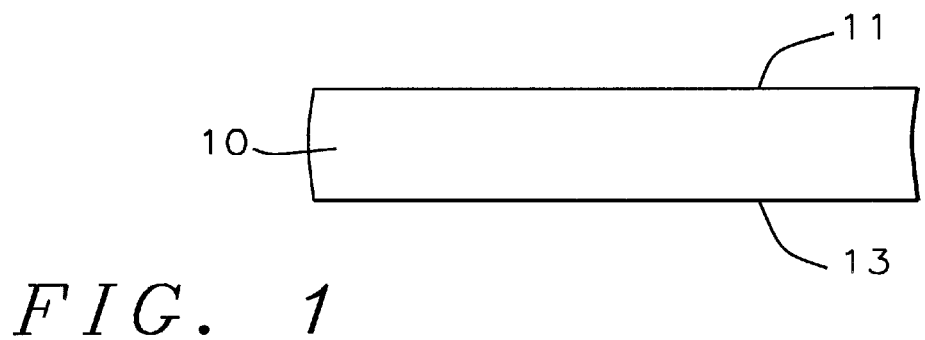
FIGS. 1 and 2 schematically illustrate in cross-sectional representation a first embodiment of the present invention.

Accordingly FIG. 1 shows a schematic cross-sectional diagram of semiconductor wafer 10 that may be comprised of silicon or silicon-on-insulator (SOI). Wafer 10 has front side 11 and backside 13. Front side 11 of wafer 10 is the side of wafer 10 upon which semiconductor devices will be formed, e.g. source, drain, FETs, etc.

Unless otherwise specified, all structures, layers, etc. may be formed or accomplished by conventional methods known in the prior art.

First Embodiment

Figure 2:
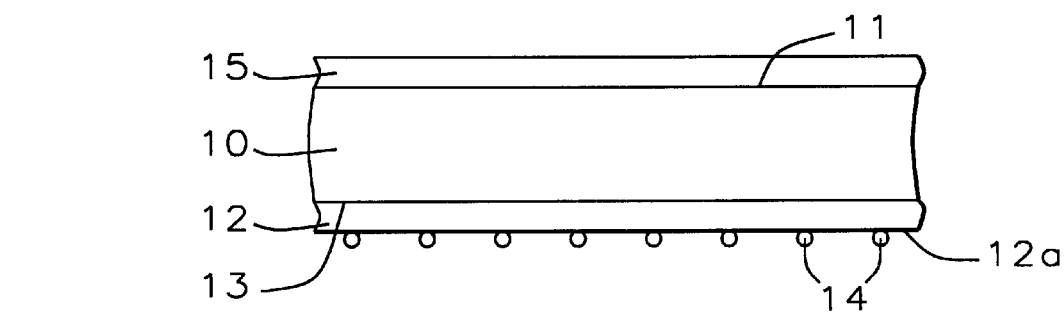

FIG. 2 (with the common FIG. 1) illustrates the first embodiment of the present invention.

As shown in FIG. 2, aluminum or an aluminum alloy such as aluminum-copper, aluminum-silicon, or aluminum-copper-silicon more preferably aluminum is deposited on the backside 13 of wafer 10 to form aluminum/aluminum alloy layer 12 before electroplating between copper (shown as layer 15) on the front side 11 of wafer 10 as discussed below. A barrier layer (not shown) such as binary and tertiary metal nitrides, e.g. TiN or TaN, or metal silicon nitrides, e.g. Ta$_x$Si$_y$N$_z$, may also be used in conjunction with aluminum/aluminum alloy layer 12.

For purposes of illustration, aluminum/aluminum alloy layer 12 will be referred to as aluminum layer 12. Wherever "aluminum" is used hereafter, it will be considered to be either aluminum or any of the aluminum alloys specified above unless specifically noted otherwise.

A key point of the invention is that aluminum is a 'natural getterer' for copper and will bind elemental copper very securely. That is mobile ionic or elemental copper become attached to, or trapped in, aluminum layer 12 and are thus prevented from traveling or transporting into wafer 10 surfaces 11, 13. This phenomenon is called gettering. Thus, cross contamination from copper will be eliminated from, for example, the fabrication tools.

The aluminum is preferably deposited by sputtering to form thin aluminum layer 12, but in any case before deposition of copper, at the parameters including: pressure—from about 0.1 to 9000 mTorr; DC power—from about 500 to 10,000 W; nitrogen gas flow—from about 0 to 30 sccm; and argon gas flow—from about 0 to 100 sccm.

Aluminum layer 12 is from about 20 to 10,000 Å thick, more preferably from about 750 to 7000 Å thick, and most preferably from about 1000 to 5000 Å thick.

Copper may then be deposited over the front side 11 of wafer 10 to form, for example, plugs, lines, bonding pads, etc., by, for example electroplating, PVD or CVD. For purposes of illustration, any copper so deposited will be represented by copper layer 15.

If wafer 10 is immersed into a copper electroplating bath, the pH of the electroplating bath must be compatible with aluminum to protect aluminum layer 12. Specifically, the electroplating bath pH must be from about 4 to 9. Alternatively, hot plating of aluminum can be performed.

Wafer 10 may then be further processed to form semiconductor devices thereon. During the passivation layer deposition (not shown), any chemi-absorbed copper 14 on surface 12a of thin aluminum layer 12 will combine with aluminum and thus would not be mobile any more.

Absorbed copper 14 is only shown for illustration purposes. Aluminum layer 12 may getter other impurities besides absorbed copper 14.

Thin aluminum layer 12 may then be removed from backside 13 of wafer 10 during a back-grinding step, e.g. after BEOL (back-end of line).

Second Embodiment

Figure 3:
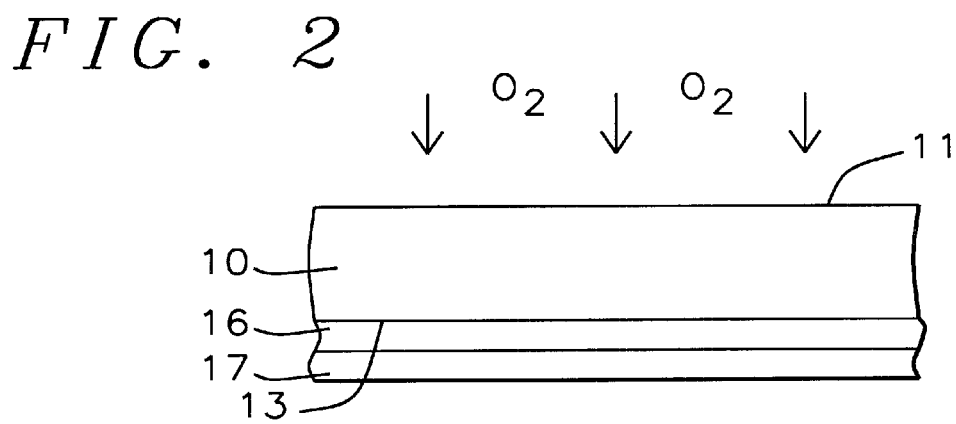
FIGS. 3 and 4 schematically illustrate in cross-sectional representation a second embodiment of the present invention.
Figure 4:
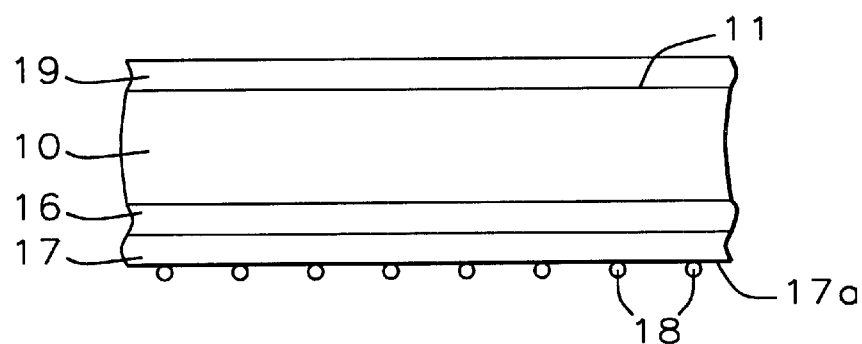

FIGS. 3 and 4 (with the common FIG. 1) illustrate the alternate embodiment of the present invention wherein the sputtered aluminum layer is partially oxidized to extend the permissible pH range of the copper electroplating bath. (As in the first embodiment "aluminum" is considered to be either aluminum or any of the aluminum alloys specified in the first embodiment unless specifically noted otherwise.)

As shown in FIG. 3, aluminum is deposited on the backside 13 of wafer 10 to form aluminum layer 16 before electroplating copper on the front side 11 of wafer 10 as discussed below.

The aluminum is preferably deposited by sputtering to form thin aluminum layer 16 at the following parameters: pressure—from about 0.1 to 9000 mTorr; DC power—from about 500 to 10,000 W; nitrogen gas flow—from about 0 to 30 sccm; and argon gas flow—from about 0 to 100 sccm.

Aluminum layer 16 is from about 20 to 10,000 Å thick, more preferably from about 750 to 7000 Å thick, and most preferably from about 1000 to 5000 Å thick.

Aluminum layer 16 is then partially oxidized by treating with oxygen to form oxidized aluminum layer 17 over aluminum layer 16 at the following parameters:

oxygen flow: from about 100 to 100,000 sccm; RF or microwave power: from about 200 to 10,000 W
time: from about 5 to 3600 seconds: and
temperature: from about 50 to 400° C.

Other gasses that are added to oxygen include a forming gas ($N_2/H_2$) and fluorocarbon. The flow ratio of oxygen to fluorocarbon, and the flow ratio of oxygen to nitrogen within the $N_2/H_2$ forming gas is from about 1:1 to 1000:1.

Oxidized aluminum layer 17 has a thickness of preferably from about 100 to 500 Å, and more preferably from about 200 to 400 Å.

Alternatively, aluminum oxide can be deposited by sputtering an aluminum oxide target at the parameters including: pressure—from about 0.1 to 9000 mTorr; RF power—from about 500 to 10,000 W; argon gas flow from about 0 to 100 sccm; an nitrogen gas flow from about 0 to 30 sccm.

Alternatively, aluminum oxide can also be formed by reactive sputtering of aluminum target with oxygen conditions.

As shown in FIG. 4, copper may then be deposited over the front side 11 of wafer 10 to form, for example, plugs, lines, bonding pads, etc., by, for example electroplating. For purposes of illustration, any copper so deposited will be represented by copper layer 19.

If wafer 10 is immersed into a copper electroplating bath, the pH of the electroplating bath must be compatible with partially oxidized aluminum to protect aluminum layer 16/oxidized aluminum layer 17. Since layer 16 is partially oxidized (i.e. oxidized layer 17), the permissible pH range of the electroplating bath is greater than in the first embodiment discussed above.

Specifically, the electroplating bath pH may be from about 4.1 to 9.1.

Wafer 10 may then be further processed to form semiconductor devices thereon. During the passivation layer deposition (not shown), any chemi-absorbed copper 18 on surface 17a of thin oxidized aluminum layer 17/aluminum layer 16 will combine with aluminum and thus would not be mobile any more.

Absorbed copper 18 is only shown for illustration purposes. Oxidized aluminum layer 17/aluminum layer 16 may getterer other impurities besides absorbed copper 18.

Thin oxidized aluminum layer 17/aluminum layer 16 may be removed from backside 13 of wafer 10 during a back-grinding step, e.g. after BEOL (back-end of line).

Regardless whether the first embodiment of second embodiment of the present invention is selected, a single aluminum sputter layer 12, 16 acts as a gettering layer for copper and can last through BEOL (back-end of line) processing. Further, aluminum gettering layer 12, 16 may be finally removed during back grinding step.

While particular embodiments of the present invention have been illustrated and described, it is not intended to limit the invention, except as defined by the following claims.

We claim:

1. A method of preventing copper transport on a semiconductor wafer, comprising the steps of:

providing a semiconductor wafer having a front side and a backside;

sputtering metal on said backside of said wafer to form a layer of metal; said metal being selected from the group comprising aluminum, aluminum-copper, aluminum-silicon, and aluminum-copper-silicon; wherein said metal is sputtered at a pressure from about 0.1 to 9000 mTorr, a DC power from about 500 to 10,000 W with a nitrogen gas flow from about 0 to 30 sccm and an argon gas flow from about 0 to 100 sccm;

then depositing copper on said front side of said wafer; and further processing said wafer;

whereby said metal layer binds any stray elemental copper.

2. The method of claim 1, wherein said metal layer is from about 20 Å to 10,000 Å thick.

3. The method of claim 1, wherein said metal layer is from about 1000 Å to 5000 Å thick.

4. The method of claim 1, wherein said copper is deposited on said front side of said wafer by immersing said wafer into an electroplating bath having a pH from about 4 to 9.

5. The method of claim 1, including the steps of subjecting said wafer to back-end of line processing; and
back grinding said backside of said wafer to remove said metal layer.

6. The method of claim 1, wherein said copper deposition is accomplished by a method selected from the group including electroplating, PVD and CVD.

7. A method of preventing copper transport on a semiconductor wafer, comprising the steps of:
providing a semiconductor wafer having a front side and a backside;
sputtering metal on said backside of said wafer to form a layer of metal; said metal being selected from the group comprising aluminum, aluminum-copper, aluminum-silicon, and aluminum-copper-silicon; wherein said metal is sputtered at a pressure from about 0.1 to 9000 mTorr, a DC power from about 500 to 10,000 W, with a nitrogen gas flow from about 0 to 30 sccm and an argon gas flow from about 0 to 100 sccm;
then depositing copper on said front side of said wafer by immersing said wafer into an electroplating bath having a predetermined pH; and
further processing said wafer;
whereby said metal layer binds any stray elemental copper.

8. The method of claim 7, wherein said metal layer is from about 20 Å to 10,000 Å thick.

9. The method of claim 7, wherein said metal layer is from about 1000 Å to 5000 Å thick.

10. The method of claim 7, wherein said predetermined pH of said electroplating bath is from about 4 to 9.

11. The method of claim 7, including the steps of
subjecting said wafer to back-end of line processing; and
back grinding said backside of said wafer to remove said metal layer.

12. The method of claim 7, wherein said copper deposition is accomplished by a method selected from the group including electroplating, PVD and CVD.

13. A method of preventing copper transport on a semiconductor wafer, comprising the steps of:
providing a semiconductor wafer having a front side and a backside;
sputtering metal on said backside of said wafer to form a layer of metal; said metal being selected from the group comprising aluminum, aluminum-copper, aluminum-silicon, and aluminum-copper-silicon;
treating said wafer with oxygen to partially oxidize said metal layer;
depositing copper on said front side of said wafer; wherein said copper is deposited on said front side of said wafer by immersing said wafer into an electroplating bath having a predetermined pH from about 4.1 to 9.1; and
further processing said wafer;
whereby said partially oxidized metal layer binds any stray elemental copper.

14. The method of claim 13, wherein said metal layer is from about 20 Å to 10,000 Å thick.

15. The method of claim 13, wherein said metal layer is from about 1000 Å to 5000 Å thick.

16. The method of claim 13, wherein said metal is sputtered at a pressure from about 0.1 to 9000 mTorr, a DC power from about 500 to 10,000 W, with a nitrogen gas flow from about 0 to 30 sccm and an argon gas flow from about 0 to 100 sccm.

17. The method of claim 13, including the steps of
subjecting said wafer to back-end of line processing; and
back grinding said backside of said wafer to remove said metal layer.

18. The method of claim 13, wherein said copper deposition is accomplished by a method selected from the group including electroplating, PVD and CVD.

19. A method of preventing copper transport on a semiconductor wafer, comprising the steps of:
providing a semiconductor wafer having a front side and a backside;
sputtering metal on said backside of said wafer to form a layer of metal; said metal being selected from the group comprising aluminum, aluminum-copper, aluminum-silicon, and aluminum-copper-silicon;
treating said wafer with oxygen to partially oxidize said metal layer;
depositing copper on said front side of said wafer whereby said partially oxidized metal layer binds any stray elemental copper;
subjecting said wafer to back-end of line processing; and
back grinding said backside of said wafer to remove said partially oxidized metal layer.

20. The method of claim 19, wherein said metal layer is from about 20 Å to 10,000 Å thick.

21. The method of claim 19, wherein said metal layer is from about 1000 Å to 5000 Å thick.

22. The method of claim 19, wherein said copper is deposited on said front side of said wafer by immersing said wafer into an electroplating bath having a pH from about 4 to 9.

23. The method of claim 19, wherein said metal is sputtered at a pressure from about 0.1 to 9000 mTorr, a DC power from about 500 to 10,000 W, with a nitrogen gas flow from about 0 to 30 sccm and an argon gas flow from about 0 to 100 sccm.

24. The method of claim 19, wherein said copper deposition is accomplished by a method selected from the group including electroplating, PVD and CVD.

25. A method of preventing copper transport on a semiconductor wafer, comprising the steps of:
providing a semiconductor wafer having a front side and a backside;
sputtering metal on said backside of said wafer to form a layer of metal; said metal being selected from the group comprising aluminum, aluminum-copper, aluminum-silicon, and aluminum-copper-silicon;
treating said wafer with oxygen to partially oxidize said metal layer;
depositing copper on said front side of said wafer by immersing said wafer into an electroplating bath having a pH of from about 4.1 to 9.1; whereby said partially oxidized metal layer binds any stray elemental copper; and
further processing said wafer.

26. The method of claim 25, wherein said metal layer is from about 20 Å to 10,000 Å thick.

27. The method of claim 25, wherein said metal layer is from about 1000 Å to 5000 Å thick.

28. The method of claim 25, wherein said metal is sputtered at a pressure from about 0.1 to 9000 mTorr, a DC power from about 500 to 10,000 W, with a nitrogen gas flow from about 0 to 30 sccm and an argon gas flow from about 0 to 100 sccm.

29. The method of claim 25, including the steps of
subjecting said wafer to back-end of line processing; and
back grinding said backside of said wafer to remove said metal layer.

30. The method of claim 25, wherein said copper deposition is accomplished by a method selected from the group including electroplating, PVD and CVD.

31. A method of preventing copper transport on a semiconductor wafer, comprising the steps of:

providing a semiconductor wafer having a front side and a backside;

sputtering metal on said backside of said wafer to form a layer of metal; said metal being selected from the group comprising aluminum, aluminum-copper, aluminum-silicon, and aluminum-copper-silicon;

treating said wafer with oxygen to partially oxidize said metal layer depositing copper on said front side of said wafer by immersing said wafer into an electroplating bath having a predetermined pH whereby said partially oxidized metal layer binds any stray elemental copper;

subjecting said wafer to back-3 end of line processing; and back grinding said backside of said wafer to remove said partially oxidized metal layer.

32. The method of claim 31, wherein said metal layer is from about 20 Å to 10,000 Å thick.

33. The method of claim 31, wherein said metal layer is from about 1000 Å to 10,000 Å thick.

34. The method of claim 31, wherein said metal is sputtered at a pressure from about 0.1 to 9000 mTorr, a DC power from about 500 to 10,000 W, with a nitrogen gas flow from about 0 to 30 sccm and an argon gas flow from about 0 to 100 sccm.

35. The method of claim 31, wherein said copper deposition is accomplished by a method selected from the group including electroplating, PVD and CVD.

36. A method of preventing copper transport on a semicondutor wafer, comprising the steps of:

providing a semiconductor wafer having a front side and a backside;

sputtering metal on said backside of said wafer to form a layer of metal having a thickness from about 20 to 10,000 Å; said metal being selected from the group comprising aluminum, aluminum-copper, aluminum-silicon, and aluminum-copper-silicon;

depositing copper on said front side of said wafer by immersing said wafer into an electroplating bath having a pH of from about 4.1 to 9.1;

treating said wafer with oxygen to partially oxidize said metal layer; and further processing said wafer; whereby said partially oxidized metal layer binds any stray elemental copper.

37. A method of preventing copper transport on a semiconductor wafer, comprising the steps of:

providing a semiconductor wafer having a front side and a backside;

sputtering metal on said backside of said wafer to form a layer of metal having a thickness from about 20 to 10,000 Å; said metal being selected from the group comprising aluminum, aluminum-copper, aluminum-silicon, and aluminum-copper-silicon;

treating said wafer with an oxygen flow from about 100 to 100,000 sccm, at a RF power from about 200 to 10,000 W, at a temperature from about 50 to 400° C., for from about 5 to 3600 seconds to partially oxidize said metal layer;

depositing copper on said front side of said wafer by immersing said wafer into an electroplating bath having a predetermined pH whereby said partially oxidized metal layer binds any stray elemental copper; and further processing said wafer.

38. The method of claim 37, wherein said predetermined pH of said electroplating bath is from about 4.1 to 9.1.

39. The method of claim 37, wherein said oxygen flow comprises an oxygen mixture comprised of oxygen, fluorocarbon, and an $N_2/H_2$ forming gas wherein the flow ratio of oxygen:fluorocarbon and the flow ratio of oxygen:$N_2$ within the $N_2/H_2$ forming gas is from about 1:1 to 1000:1.

40. A method of preventing copper transport on a semiconductor wafer, comprising the steps of:

providing a semiconductor wafer having a front side and a backside;

sputtering metal on said backside of said wafer to form a layer of metal having a thickness from about 20 to 10,000 Å; said metal being selected from the group comprising aluminum, aluminum-copper, aluminum-silicon, and aluminum-copper-silicon;

treating said wafer with an oxygen flow from about 100 to 100,000 sccm, at a RF power from about 200 to 10,000 W, at a temperature from about 50 to 400° C., for from about 5 to 3600 seconds to partially oxidize said metal layer; said oxygen mixture comprised of oxygen; fluorocarbon, and an $N_2/H_2$ forming gas wherein the flow of ratio of oxygen:fluorocarbon and the flow of oxygen:$N_2$ within the $N_2/H_2$ forming gas is from about 1:1 to 1000:1;

depositing copper on said front side of said wafer by immersing said wafer into an electroplating bath having a predetermined pH whereby said partially oxidized metal layer binds any stray elemental copper; and further processing said wafer.

41. The method of claim 40, wherein said predetermined pH of said electroplating bath is from about 4.1 to 9.1.

* * * * *